United States Patent
Wu et al.

(10) Patent No.: US 7,705,641 B2
(45) Date of Patent: Apr. 27, 2010

(54) FAST RESPONSE PHASE-LOCKED LOOP CHARGE-PUMP DRIVEN BY LOW VOLTAGE INPUT

(75) Inventors: I-chang Wu, Fremont, CA (US); Chungwen Lo, Palo Alto, CA (US); Keng Leong Fong, Sunnyvale, CA (US)

(73) Assignee: Ralink Technology Corporation, Jhubei, Hsinchu County (TW)

( * ) Notice: Subject to any disclaimer, the term of this patent is extended or adjusted under 35 U.S.C. 154(b) by 0 days.

(21) Appl. No.: 12/108,329

(22) Filed: Apr. 23, 2008

(65) Prior Publication Data

US 2009/0267662 A1    Oct. 29, 2009

(51) Int. Cl.
*H03L 7/06* (2006.01)
(52) U.S. Cl. ....................... 327/157; 327/148
(58) Field of Classification Search .......... 327/148, 327/149, 156–158
See application file for complete search history.

(56) References Cited

U.S. PATENT DOCUMENTS

| | | | | |
|---|---|---|---|---|
| 6,292,061 | B1 * | 9/2001 | Qu | 331/17 |
| 6,441,655 | B1 * | 8/2002 | Fallahi et al. | 327/115 |
| 7,005,896 | B2 * | 2/2006 | Chen et al. | 327/112 |
| 7,132,880 | B2 * | 11/2006 | Ingino, Jr. | 327/541 |

\* cited by examiner

*Primary Examiner*—Lincoln Donovan
*Assistant Examiner*—Adam D Houston
(74) *Attorney, Agent, or Firm*—Sawyer Law Group, P.C.

(57) ABSTRACT

Phase-locked loop charge pump driven by low voltage input. In one aspect, a charge pump for a phase-locked loop circuit includes a sourcing current transistor providing a sourcing current, wherein the sourcing current transistor is coupled to a high-voltage operating voltage supply. A sourcing control circuit uses low-voltage sourcing control signals to selectively cause the charge pump to source the sourcing current to an output of the charge pump, and a sinking control circuit uses low-voltage sinking control signals to selectively cause the charge pump to sink the sinking current from the output.

12 Claims, 7 Drawing Sheets

FAST RESPONSE PHASE-LOCKED LOOP CHARGE-PUMP DRIVEN BY LOW VOLTAGE INPUT

FIELD OF THE INVENTION

The present invention relates generally to a fast-response phase-locked loop charge pump, and more specifically to the charge pump being driven by low voltage input.

BACKGROUND OF THE INVENTION

Phase-locked loops (PLLs) are used extensively in electronic circuits to generate a signal that has a fixed relation to the phase of a reference signal. A PLL circuit raises or lowers the frequency of a controlled oscillator signal until it matches the reference signal in both frequency and phase. Phase-locked loops are widely used in electronic applications to, for example, generate stable frequencies, recover a signal from a noisy communication channel, or distribute clock timing pulses in digital logic designs.

In conventional PLL circuits, all PLL components operate at the same voltage supply level. Thus, an oscillator providing a reference signal, a phase frequency detector, a charge pump, low pass loop filter, voltage-controlled oscillator (VCO), and frequency divider all may operate at, for example, 3.3 volts. However, in a more recent deep sub-micron process, the operating voltages of all the digital blocks can be reduced, e.g. to around 1 volt, to save power while achieving higher speed. These digital blocks can include the frequency divider, prescaler, phase frequency detector, VCO, and reference signal oscillator. A higher voltage, however, is still desired as the operating voltage for the charge pump to minimize jitter, noise, leakage, and linearity distortion, and to achieve a high tuning range for the VCO.

To allow the charge pump to operate at a higher voltage level, an open drain circuit or a cross-coupled voltage level shifter is typically used to convert the low voltage control signals from the phase frequency detector to a higher voltage level that controls the charge pump. However, the low speed performance of voltage level shifters may cause large jitter and noise in the PLL circuit. Likewise, an open drain circuit is a significant contributor of jitter and noise in the PLL. Other designs compromise the optimization by requiring that all components of the PLL circuit function at the same voltage level, either at the higher voltage or at the lower voltage.

Accordingly, a system and method that operates a charge pump in a PLL circuit at higher voltage while operating other components of the PLL circuit at a lower voltage without significantly increasing jitter and noise in the PLL circuit, would be desirable in many applications.

SUMMARY OF THE INVENTION

The invention of the present application relates to a phase-locked loop charge-pump driven by low voltage input. In one aspect of the invention, a charge pump for a phase-locked loop circuit includes a sourcing current transistor providing a sourcing current, wherein the sourcing current transistor is coupled to a high-voltage operating voltage supply. A sourcing control circuit uses low-voltage sourcing control signals at a low voltage to selectively cause the charge pump to source the sourcing current to an output of the charge pump. A sinking control circuit uses low-voltage sinking control signals at a low voltage to selectively cause the charge pump to sink the sinking current from the output of the charge pump.

In another aspect of the invention, a phase frequency detector operates at a low voltage and provides low-voltage sourcing control signals and low-voltage sinking control signals at the low voltage. A charge pump operates at a high voltage and includes a sourcing control circuit coupled to the low-voltage sourcing control signals and selectively causing the charge pump to source the sourcing current to an output of the charge pump based on the low-voltage sourcing control signals. The charge pump also includes a sinking control circuit that receives the low-voltage sinking control signals and selectively causes the charge pump to sink the sinking current from the output of the charge pump based on the low-voltage sinking control signals.

In another aspect of the invention, a method for sourcing and sinking current using a charge pump in a phase-locked loop includes providing a sourcing current using a sourcing current transistor, where the sourcing current transistor is coupled to a high-voltage operating voltage supply of the charge pump. The charge pump is selectively caused to source the sourcing current to an output of the charge pump using a sourcing control circuit receiving low-voltage sourcing control signals. A sinking current is provided using one or more sinking current transistors, wherein one of the sinking current transistors is coupled to ground. The charge pump is selectively caused to sink the sinking current from the output of the charge pump using a sinking control circuit coupled to at least one of the sinking transistors, the sinking control circuit receiving low-voltage sinking control signals.

The present invention provides a charge pump for a PLL circuit which can operate at a high voltage and receive low voltage control signals to control the charge pump output. The low voltage control signals need not be level shifted or otherwise increased to the operating voltage of the charge pump before being received at the charge pump, thus reducing jitter and noise in the PLL circuit while still allowing other components of the PLL circuit to operate at a low voltage.

BRIEF DESCRIPTION OF THE FIGURES

FIG. 3 is a schematic diagram illustrating a charge pump of the present invention in which sourcing and sinking currents are turned on;

FIG. 5 is a schematic diagram illustrating the charge pump of FIG. 3 in which only the sourcing current is turned on; and FIG. 6 is a schematic diagram illustrating the charge pump of FIG. 3 in which only the sinking current is turned on.

DETAILED DESCRIPTION

The present invention relates generally to a fast-response phase-locked loop charge pump, and more specifically to the charge pump being driven by low voltage input. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

The present invention provides an advantage of non-rail-to-rail differential current switching. Consequently, the need for an open drain or voltage level shifter is eliminated. The differential current switch of the present invention not only offers high speed switching and low jitter, but also makes the system less sensitive to the coupled noise.

To more particularly describe the features of the present invention, please refer to FIGS. 1 and 3-6 in conjunction with the discussion below.

Figure 1:
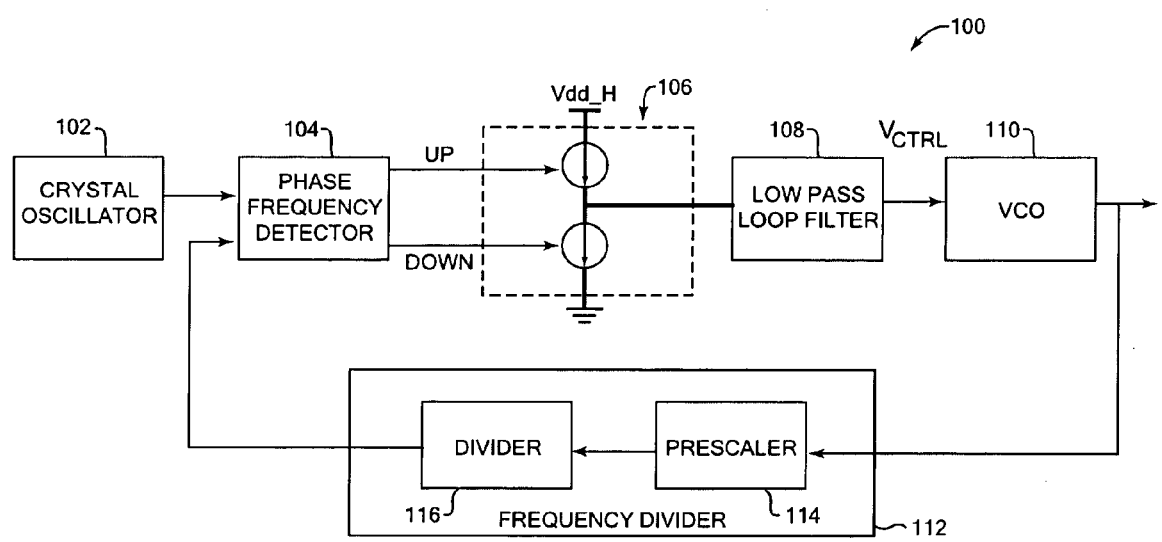
FIG. 1 is a block diagram of a phase-locked loop (PLL) circuit suitable for use with the present invention.

FIG. 1 is a block diagram of a PLL circuit 100 suitable for use with the present invention. PLL circuit 100 includes a crystal oscillator 102 as a reference signal, a phase frequency detector 104, a charge pump 106, a low pass loop filter 108, a voltage-controlled oscillator (VCO) 110, and a frequency divider 112. Generally, VCO 110 generates a periodic output signal. The phase frequency detector 104 receives the reference signal from oscillator 102 and the output from the VCO 110 as a feedback signal, and compares the two signals to provide up (source) and down (sink) signals to the charge pump 106 in proportion to the phase error detected between the two signals. The charge pump is used to create a higher or lower voltage signals for the VCO. The charge pump 106 supplies charge amounts in proportion to the received signals to the low pass loop filter 108, and the filter smooths out abrupt changes in the control voltage and provides the control voltage to the VCO 110. The VCO 110 provides the output to the circuit and the feedback signal to the frequency divider 112, which provides the divided signal back to the phase frequency detector 104. The frequency divider includes a prescaler 114 and a divider 116 and causes the PLL's output signal frequency to be an integer multiple of the reference signal. Thus, the phase frequency detector 104 matches the VCO output to the phase of the reference signal from oscillator 102 and provides output signals that control the VCO such that the phase difference between the two inputs to the detector 104 is held constant.

In a previous design, all PLL blocks operate at the same voltage supply level, for example 3.3 volts. In more recent deep sub-micron processes, the operating voltages of the digital blocks can be reduced to save power while achieving higher speed, e.g. to around 1 volt, including the frequency divider 112, prescaler 114, phase frequency detector 104, VCO 110, and oscillator 102. A higher voltage is still used as the operating voltage for the charge pump 106 to minimize jitter, noise, leakage, and linearity distortion, and to achieve a high tuning range for the VCO.

Figure 2A:
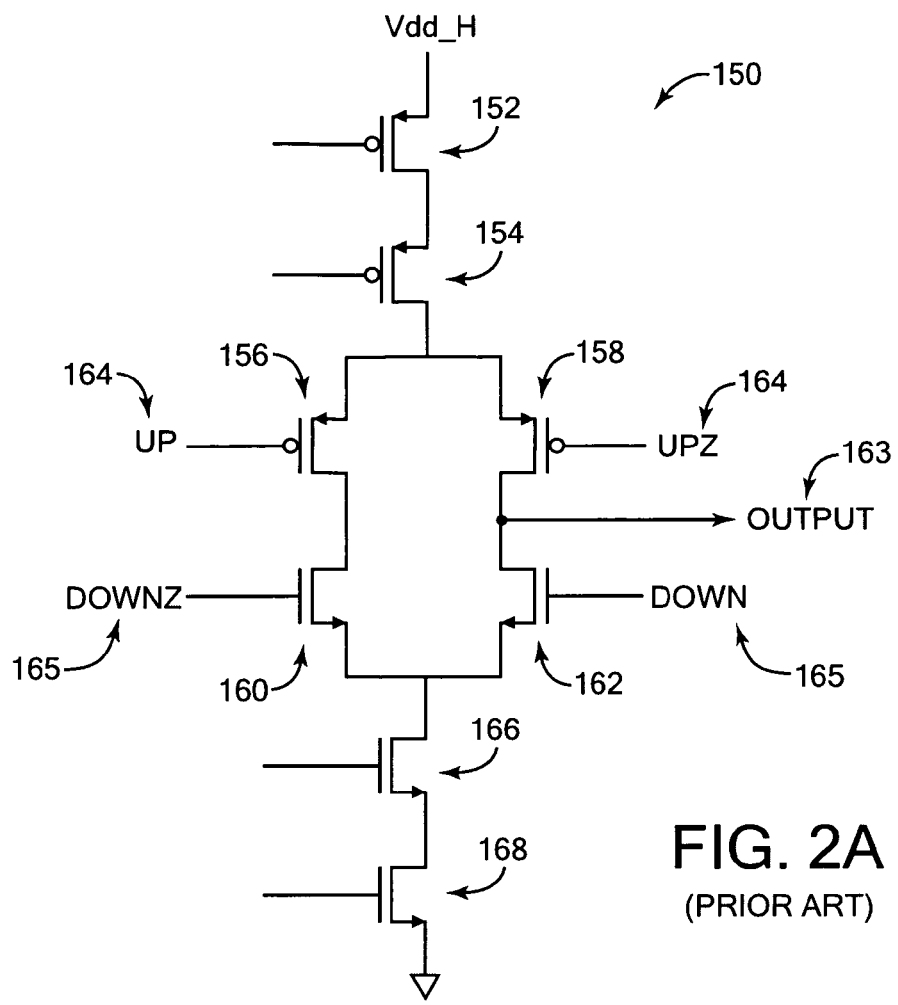
FIG. 2A is a schematic diagram illustrating a previous charge pump of a PLL circuit.

FIG. 2A is a schematic diagram of a previous charge pump 150 in which the control signals from the phase frequency detector at a higher voltage level. Charge pump 150 includes PMOS transistors 152, 154, 156, and 158, which provide a sourcing function, and NMOS transistors 168, 166, 160, and 162, which provide a sinking function. Transistor 152 is a sourcing transistor that provides the sourcing current, and optional transistor 154 is a cascode device which can increase the impedance of the current source. Transistor 152 is coupled at its source to an operating voltage of the charge pump, the high voltage Vdd_H, and transistor 154 is coupled at its drain to the sources of PMOS control transistors 156 and 158. NMOS control transistors 160 and 162 are coupled to the PMOS control transistors 156 and 158, respectively. NMOS transistor 168 and optional NMOS cascode transistor 166 are coupled between the NMOS control transistors 160 and 162 and ground.

Transistors 156 and 158 form a differential switch. Control signals UP and UPZ 164 are provided to the PMOS control transistors 156 and 158 and are complementary, able to steer current to either side. When UP equals Vdd_L (the low voltage), transistor 156 is off, and UPZ equals 0, turning on PMOS transistor 158, the current from sourcing current source 152 and cascode device 154 is steered to the output 163, such that the charge-pump sourcing function is turned on. When UP equals 0, transistor 156 is on, and UPZ equals Vdd_L, turning off PMOS transistor 158, the current from sourcing current source 152 and cascode device 154 is steered away from the output 163, such that the charge-pump sourcing function is turned off.

Control signals DOWN and DOWNZ 165 are provided to the NMOS control transistors 160 and 162. When DOWN equals "High", transistor 162 is on, and DOWNZ equals 0, turning off NMOS 160, the sinking current from the output 163 is steered through the NMOS 162 switch to cascode device 166 and sinking current source 168, such that the charge-pump sinking function is turned on. When DOWN equals 0, transistor 162 is off, and DOWNZ equals "High", turning on transistor 160, there is no sinking current through transistor 168, such that the charge-pump sourcing sinking is turned off.

The charge pump 150 requires control signals to be at a higher voltage for it to operate properly. If low voltage control signals are provided by a phase frequency divider to the charge pump 150, these signals must be level shifted higher (or an open drain circuit used) to turn on either NMOS transistor 160 or 162. Since transistor 160 and 162 are operating at a voltage level higher than Vdd-L, the control signal voltage at the gates therefore has to be level-shifted to the higher voltage level Vdd_H from the lower voltage level provided by the phase frequency detector 104.

Figure 2B:
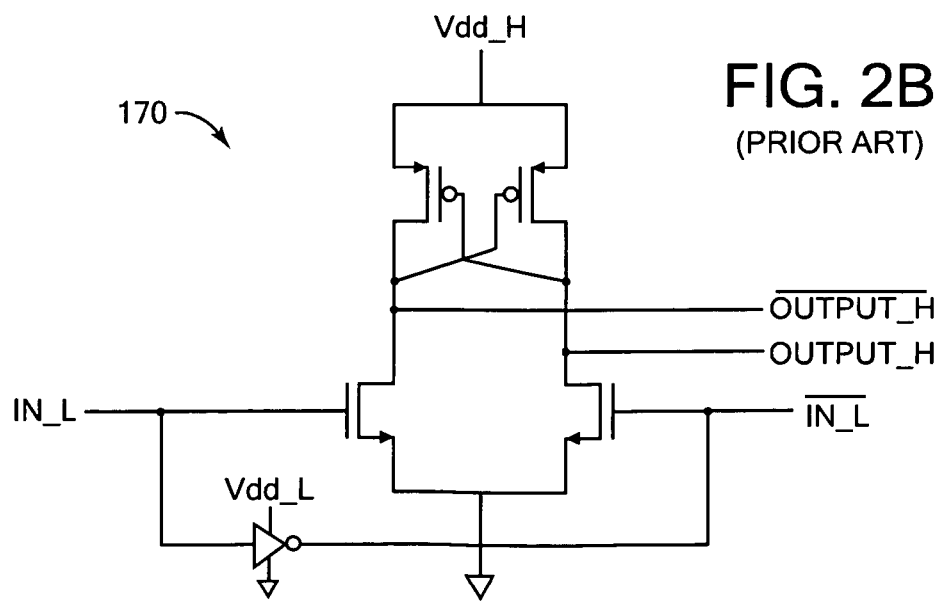
FIG. 2B is a schematic diagram illustrating an example level shifter used for the previous charge pump of FIG. 2A.

FIG. 2B is one example of a level shifter 170 used in a previous charge pump such as charge pump 150. A low voltage control signal (IN-L) from the phase frequency detector can be shifted to a higher voltage from supply voltage Vdd_H, and provide the high voltage output signals OUTPUT_H and its inverse, which are provided to the charge pump 150 as signals DOWN and DOWNZ, respectively (another level shifter can be used to provide high voltage control signals UP and UPZ). However, problems with the level shifter 170 and similar circuits include a slower response time, which increases the jitter and noise in the PLL circuit.

Figure 2C:
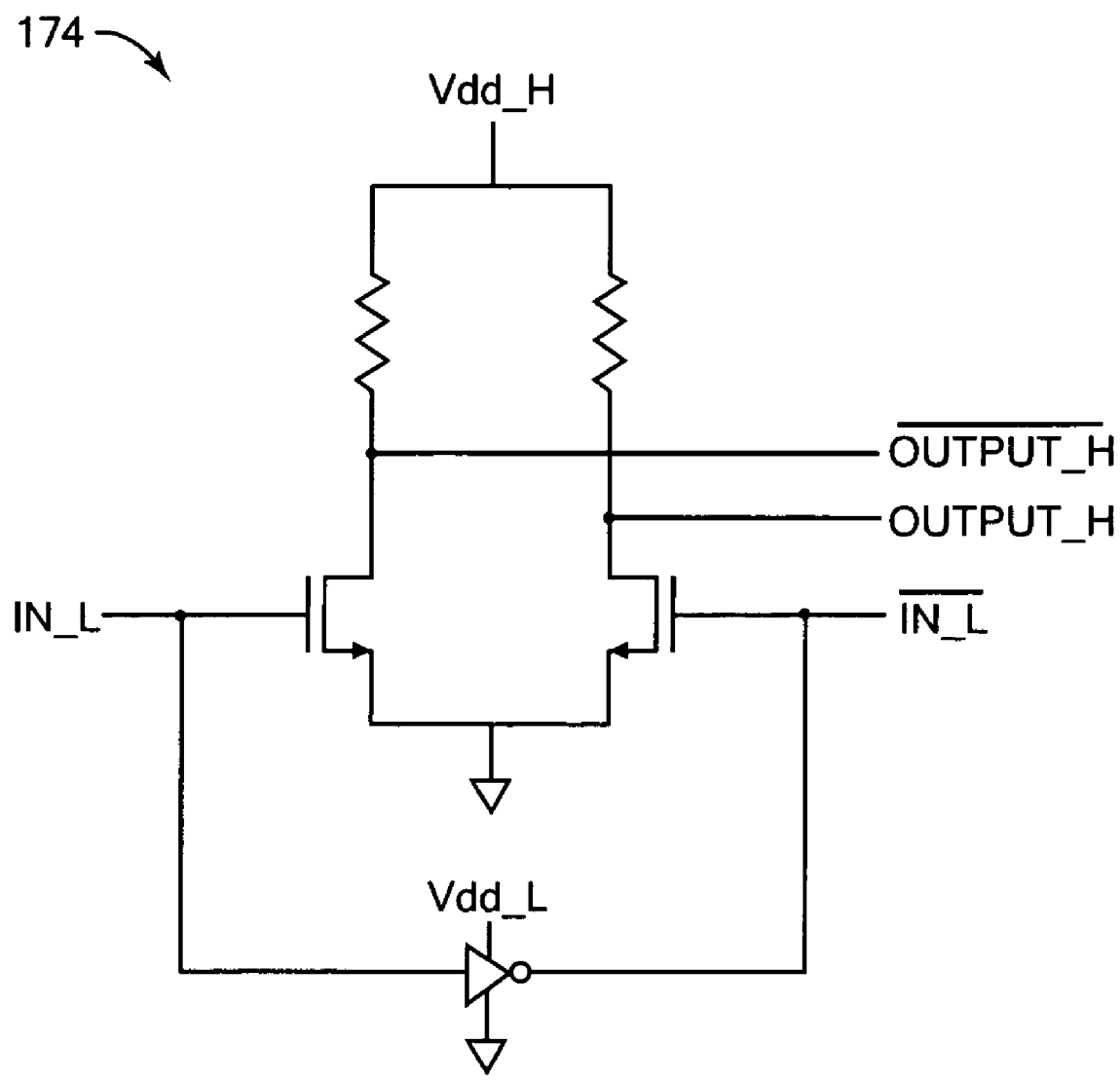
FIG. 2C is a schematic diagram illustrating an example open drain used for the previous charge pump of FIG. 2A.

FIG. 2C shows an example of an open drain circuit 174 that can alternatively be used to provide high voltage control signals, but which increases jitter and noise. The open drain circuit 174 uses weak resistors to replace the PMOS transistors of the level shifter 170. Therefore, the NMOS transistors used for pulling down current are fast; the weak resistors eventually pull the output to high voltage when an NMOS transistor is off, but it is very slow because of the weak resistance of the resistors. If the resistors have a high resistance, the NMOS transistors pulling down of the current is slow because of the opposite pulls between the NMOS transistors and the resistors.

Figure 3:
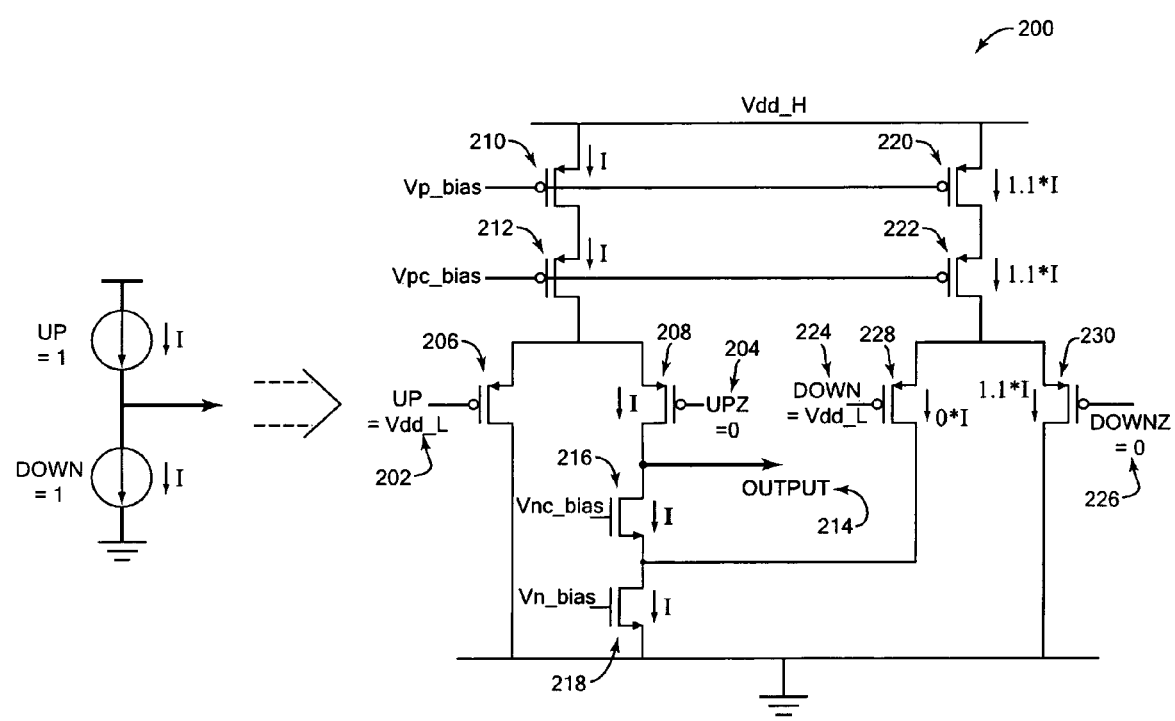

FIG. 3 is a schematic diagram illustrating a charge pump 200 of the present invention, which can receive lower voltage control signals directly from a phase frequency detector 104 without requiring a level shifter, open drain circuit, or other circuit to increase the control signal voltage to the higher operating voltage of the charge pump.

A sourcing current is provided by sourcing current transistor 210, where transistor 210 is coupled at its source to an operating voltage of the charge pump, the high voltage Vdd_H. An optional cascode transistor 212 can be coupled at its source to the drain of transistor 210, and can increase the impedance of the current source. In one example, the high voltage Vdd_H is about 3.3 V, but can be any suitable operating voltage for a charge pump. A bias voltage Vp_bias is provided at the gate of transistor 210 and Vpc_bias provided at the gate of transistor 212. All the bias voltages shown herein can be generated by a well-known current mirror structure (not shown), for example, or other source. The bias voltages depend upon the current, silicon process, voltage, and temperature of the circuit, e.g., a current mirror structure can automatically adjust the bias voltages to make the current sources the same as a reference current (not shown).

Control signals UP 202 and UPZ 204 are low voltage supply (Vdd_L) signals as provided by the phase frequency detector 104, where UPZ is the inverse of UP. Vdd_L is the lower voltage (below Vdd_H) at which other components of the PLL circuit are operating, such as the phase frequency detector 104. For example, if Vdd_H for the charge pump is approximately 3.3 volts, the low operating voltage Vdd_L of the phase detector 104 can be 1 volt, or some other voltage lower than 3.3 volts. The UP signals 202 and 204 are input to the gates of control transistors 206 and 208, respectively, which are coupled at their sources to the drain of transistor 212. Transistor 206 is coupled to ground at its drain, and transistor 208 is coupled at its drain to the output 214 of the charge pump and to the drain of an NMOS transistor 216. Transistor 216 is coupled at its source to the drain of an NMOS transistor 218, which is coupled to ground at its source. Bias voltages Vnc_bias and Vn_bias are provided to the gates of the transistors 216 and 218, respectively. NMOS transistor 216 is a "folded cascode" transistor, which is not optional in the described charge pump circuit because of its use for current subtraction ($I_{216}=I_{218}-I_{228}$), as described below.

Transistors 206 and 208 are sourcing control transistors that form a differential switch and or control circuit that steers the direction of the PMOS sourcing current from transistors 210 and 212 based on the control signals UP 202 and 204. One example is shown in FIG. 3, where the control signal UPZ 204 is equal to 0 and the other control signal UP 202 is equal to Vdd_L. In this case, transistor 206 is turned off, and transistor 208 is turned on, and the current from sourcing current source 210 and cascode device 212 is steered to the output 214, such that the charge pump sourcing function is turned on. The sourcing current I is delivered to the loop filter 108 via output 214 through PMOS transistor 208. Because the sourcing control transistors 206 and 208 are p-channel, the lower voltage from the phase frequency detector 104 to be used to control these transistors.

The lower voltage signals cannot directly control the NMOS switch composed of transistors 216 and 218. Therefore, a folded structure is used in the described embodiment of the invention. PMOS current mirror transistor 220 sources current and is coupled to voltage Vdd_H at its source, and optional cascode mirror transistor 222 can be coupled at its source to the drain of transistor 212 and can increase the impedance of the current source. The bias voltage Vp_bias is provided at the gate of transistor 220 and the bias voltage Vpc_bias provided at the gate of transistor 222. PMOS transistor 220 provides current through the folded structure. The transistors 220 and 222 are slightly larger than the transistor 210 and 212 counterparts so that they will provide enough current margin to cover process variations. For example, in FIG. 3 the transistors 220 and 222 are about 10% larger so that their current is about 10% larger (a slightly larger current of 1.1(I) is provided), making sure that there is enough margin for subtracting the NMOS transistor 218 current (described below).

Control signals DOWN 224 and DOWNZ 226 are provided directly as lower voltage (Vdd_L) supply signals from the phase frequency detector 104, where DOWNZ is the inverse of DOWN. The DOWN signals 224 and 226 are input to the gates of PMOS sinking control transistors 228 and 230, respectively, which are coupled at their sources to the drain of transistor 222 and make up a sinking control circuit. Transistor 228 is coupled at its drain to the drain of NMOS transistor 218, and transistor 230 is coupled at its drain to ground.

The transistors 216 and 218 are sinking transistors, where the folded NMOS transistor 216 provides the sinking current. NMOS transistor 216 provides sinking current which is equal to the NMOS transistor 218 current minus the PMOS transistor 228 current ($I_{216}=I_{218}-I_{228}$). When the control signal DOWN 224 is equal to Vdd_L and the other control signal DOWNZ 226 is equal to 0, as shown in FIG. 3, transistor 228 is turned off, transistor 230 is turned on, and the current from source transistor 220 and cascode device 222 (1.1(I)) is steered to ground via control transistor 230. This causes the current in transistor 216 to be equal to the current in transistor 218. Consequently, the current sunk from the loop filter 108 via output 214 and through NMOS transistor 216 is equal to the current on NMOS transistor 218, and the charge pump sinking function is turned on.

Thus there are two sides of the charge pump circuit, where one side provides the sourcing function and includes transistors 210, 212, 206, and 208, and the other side provides the sinking function and includes transistors 220, 222, 228, 230, 216, and 218. The transistors 206 and 208 form a differential current switch using the complementary UP and UPZ signals which steer the current flow to either side. Transistors 220, 222, 228, 230, 216, 218 provide the sinking function, which is a folded design (an NMOS transistor folded to a PMOS transistor), and where the cascode NMOS 216 is not optional.

Because the sinking control transistors 228 and 230 are P-channel, signals of the lower voltage Vdd_L from the phase frequency detector 104 can be used to control these transistors. This is unlike the previous charge pumps that require high-voltage (Vdd_H) control signals to control the sinking current. This difference is due to the use of only PMOS transistors in the present invention as control transistors.

The different biasing characteristics required by P-channel and N-channel devices allow the lower voltage to be use in the present invention. A P-channel FET is switched ON when its gate voltage is lower than its source voltage and drain voltage by a threshold value. An N-channel FET is switched ON when its gate voltage is higher than its source voltage and drain voltage by a threshold value. As explained above with respect to FIG. 2A, an N-channel FET switch must have a gate voltage that is a threshold value higher than its source voltage. The voltage at the gate of NMOS control transistors therefore has to be at the higher voltage level. However, when using P-channel FETs as in the present invention, the gate voltage is always below the source voltage (Vdd_H). As long as the source voltage maintains a value equal to or greater than the threshold voltage above the gate voltage while the switch is on, the transistor can be turned on. Thus, no additional level-shifting circuit, open drain configuration, or other implementation to increase the gate voltage is required.

Figure 4:
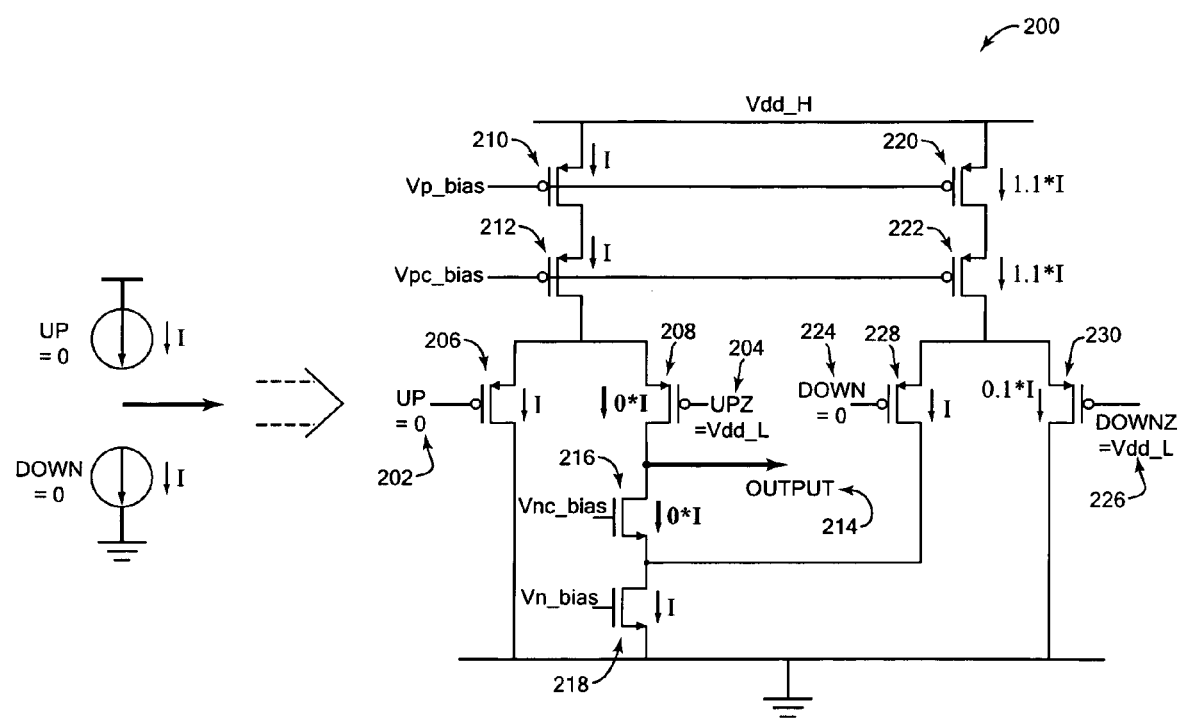
FIG. 4 is a schematic diagram illustrating the charge pump of FIG. 3 in which sourcing and sinking currents are turned off.

FIG. 4 is a schematic diagram illustrating the charge pump circuit 200 of the present invention in a condition such that both sourcing and sinking currents are turned off. The control signal UPZ 204 is equal to Vdd_L while the other control signal UP 202 is equal to 0. This causes transistor 206 to be turned on and transistor 208 to be turned off, causing the current from source transistor 210 and device 212 to be steered to ground. Thus, the charge pump sourcing function is turned off and there is no sourcing current delivered from the output 214 to the loop filter 108.

The control signal DOWN 224 is equal to 0 while the other control signal DOWNZ 226 is equal to Vdd_L. This causes PMOS transistors 220, 222, 228 and NMOS transistor 218 to form a current path. The current through PMOS transistor 228 is equal to the current through NMOS transistor 218, which causes the current on NMOS transistor 216 to be equal to 0. Thus, the current sunk from the loop filter 108 through the output 214 is 0 and the sinking function is turned off. The control signal DOWNZ 226 on the gate of PMOS transistor 230 is equal to Vdd_L, which does not fully turn the current off. This is indicated by a current of 0.1 I in the example of FIG. 4. This additional current is used to cover the process variation in PMOS transistors 220 and 222 and is dumped to ground through PMOS transistor 230.

Figure 5:
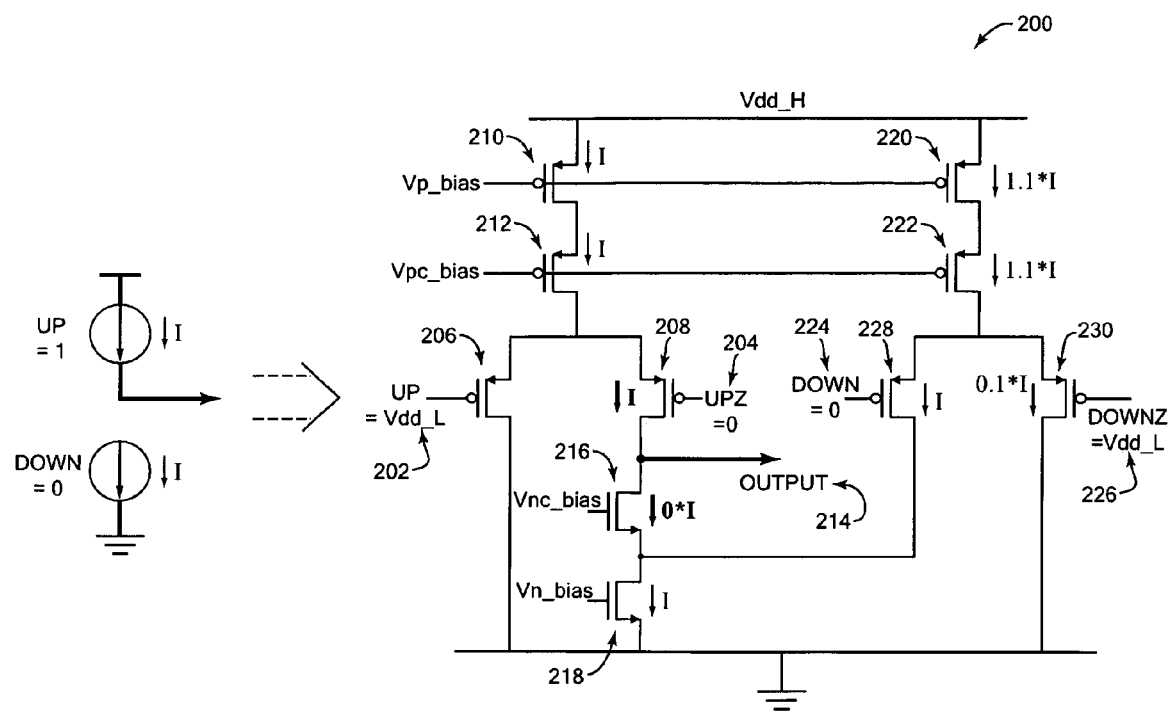

FIG. 5 is a schematic diagram illustrating the charge pump circuit 200 of the present invention in a condition such that only the sourcing current is turned on. The control signal UPZ 204 is equal to 0 while the other control signal UP 202 is equal to Vdd_L, causing the sourcing current in transistors 210 and 212 to be directed to the output 214 and the loop filter via the transistor 208, thus causing the current sourcing function to be on. The control signal DOWN 224 is equal to 0 while the other control signal DOWNZ 226 is equal to Vdd_L. As in FIG. 4, this causes PMOS transistors 220, 222, 228 and NMOS transistor 218 to form a current path, and causes the current on NMOS transistor 216 to be equal to 0. Thus, the current sunk from the loop filter 108 through the output 214 is 0, and the current sinking function is off.

Figure 6:
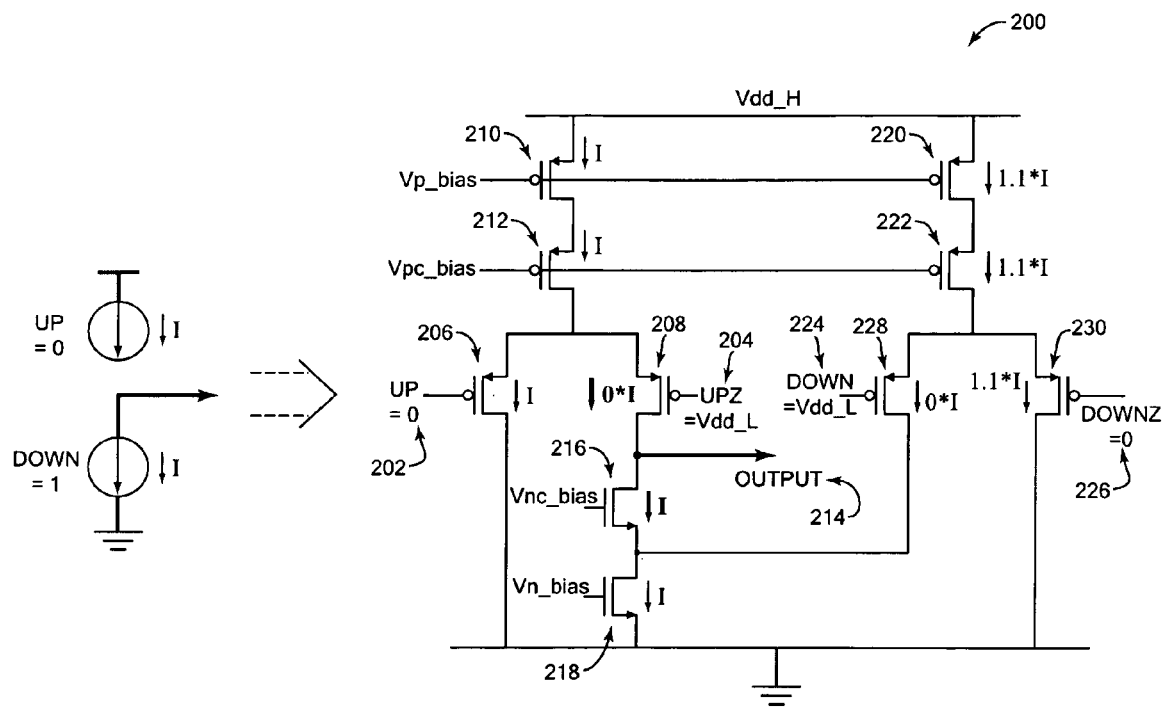

FIG. 6 is a schematic diagram illustrating the charge pump circuit 200 of the present invention in a condition such that only the sinking current is turned on. The operation is similar to that mentioned above in FIGS. 3 and 4 where appropriate. The control signal UPZ 204 is equal to Vdd_L while the other control signal UP 202 is equal to 0, causing the sourcing current in transistors 210 and 212 to be directed to ground via the transistor 206, such that no current is sourced to the output and the current sourcing function is off. The control signal DOWN 224 is equal to Vdd_L while the other control signal DOWNZ 226 is equal to 0, causing zero current in transistor 228 and thus allowing the current sinking function to be on, where current is sunk from the loop filter through the output by NMOS transistor 216 to transistor 218 and ground.

The invention allows PLL-based circuits, such as circuits providing a Frequency Synthesizer, Clock and Data Recovery functions, and/or Clock Generator to use different levels of supply or operating voltages between internal components, such as prescaler 114, frequency divider 116, phase frequency detector 104, and charge-pump 106, and reduce the jitter and noise between components having different operating voltages. The design is optimized to achieve low power, small size, low jitter, fast response, good linearity, and low phase noise.

The invention improves a PLL circuit by reducing the size, power, jitter, and phase noise of the circuit, while improving the linearity and speeds-up the response time. The invention provides a high performance and low cost PLL, Frequency Synthesizer, and Clock and Data Recovery. Advantages include smaller size, lower power, lower jitter, lower phase noise, better linearity, and faster response time.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A charge pump for a phase-locked loop circuit, the charge pump comprising:
    a sourcing current transistor providing a sourcing current, wherein the sourcing current transistor is coupled to a high-voltage operating voltage supply;
    a sourcing control circuit coupled to the sourcing current transistor, the sourcing control circuit using low-voltage sourcing control signals at a low voltage to selectively cause the charge pump to source the sourcing current to an output of the charge pump, wherein the low-voltage sourcing control signals have not been level shifted in voltage level to a higher voltage than the low voltage to selectively cause the charge pump to source the sourcing current, and wherein the sourcing control circuit includes a plurality of PMOS transistors forming a sourcing switch used for steering the current flow either to an output of the charge pump or to ground based on the sourcing control signals; and
    a sinking control circuit coupled to one or more sinking current transistors, the current sinking control circuit using low-voltage sinking control signals at a low voltage to selectively cause the charge pump to sink the sinking current from the output of the charge pump, wherein the low-voltage sinking control signals have not been level shifted in voltage level to a higher voltage than the low voltage to selectively cause the charge pump to sink the sinking current, and wherein the sinking control circuit includes a plurality of PMOS transistors forming a sinking switch used for steering the current flow either to ground or to the one or more sinking transistors based on the sinking control signals.

2. The charge pump of claim 1 wherein one of the sinking current transistors sinks the sinking current, and wherein one of the sinking current transistors is coupled to ground.

3. The charge pump of claim 2 wherein the low-voltage sourcing control signals and the low-voltage sourcing control signals are received from a phase frequency detector of the phase-locked loop circuit, the phase frequency detector having an operating voltage equal to the low voltage.

4. The charge pump of claim 3 wherein the low-voltage sourcing control signals and the low-voltage sinking control signals are received directly from the phase frequency detector without providing an increase in the voltage level of the control signals.

5. The charge pump of claim 2 wherein the one or more sinking current transistors include an NMOS sinking transistor and an NMOS current mirror that provides a current subtraction to determine the sinking current in the NMOS sinking transistor.

6. The charge pump of claim 2 further comprising a plurality of mirror transistors, at least one of the mirror transistors coupled to the high-voltage operating voltage supply, and wherein the sinking control circuit is coupled to at least one of the mirror transistors.

7. The charge pump of claim 2 wherein the one or more sinking current transistors is a first sinking transistor and a second sinking transistor, and wherein a first transistor of the current sinking control circuit has a drain coupled between the sinking current transistors, such that the sinking current is provided by the first sinking transistor and is equal to the current through the second sinking transistor minus the current through the first transistor of the current sinking control circuit.

8. The charge pump of claim 1 wherein the low-voltage sourcing control signals include a sourcing control signal and a complementary sourcing control signal, and wherein the low-voltage sinking control signals include a sinking control signal and a complementary sinking control signal.

9. The charge pump of claim 1 wherein the sourcing control circuit includes a plurality of PMOS transistors used for switching the current flow through the charge pump based on the sourcing control signals, wherein the sources of the PMOS transistors are connected to the sourcing current transistor.

10. The charge pump of claim 1 wherein the PMOS transistors of the sinking control circuit are coupled to a different sourcing current transistor that is mirrored from the sourcing current transistor.

11. The charge pump of claim 1 wherein the one or more sinking current transistors is a first sinking transistor and a second sinking transistor, and wherein a first transistor of the current sinking control circuit has a drain coupled between the sinking current transistors, and a second transistor of the current sinking control circuit has a drain coupled to ground.

12. The charge pump of claim 1 wherein the one or more sinking current transistors include:
   an NMOS sinking current transistor that provides part of the sinking current, and
   a second NMOS transistor coupled to ground,
   the charge pump further comprising:
   a PMOS sinking current source providing part of the sinking current and including one or more PMOS transistors, wherein the PMOS sinking current source is coupled to the high-voltage operating voltage supply and to the sinking switch,
   wherein a drain of a first PMOS transistor of the sinking switch is coupled between the NMOS sinking current transistor and the second NMOS transistor, such that the sinking current through the NMOS sinking current transistor is equal to the current through the first PMOS transistor subtracted from the current through the second NMOS transistor.

* * * * *